United States Patent [19]
Gamet et al.

[11] 4,016,526
[45] Apr. 5, 1977

[54] SUPERCONDUCTIVE SWITCH

[75] Inventors: Brigitte Gamet, Leuville-sur-Orge; Jean-Claude Renard, Chilly Mazarin, both of France

[73] Assignee: Compagnie Generale d'Electricite, Paris, France

[22] Filed: Mar. 21, 1975

[21] Appl. No.: 560,451

[30] Foreign Application Priority Data
Apr. 18, 1974 France .................. 74.13556

[52] U.S. Cl. .................. 338/325; 335/216
[51] Int. Cl.² .................. H01L 43/08
[58] Field of Search ........... 338/325; 335/216; 200/166 C

[56] References Cited
UNITED STATES PATENTS

| | | | |
|---|---|---|---|
| 3,310,767 | 3/1967 | Buchhold | 338/325 |
| 3,363,207 | 1/1968 | Brechna | 335/216 |
| 3,549,952 | 12/1970 | Sole | 335/216 X |
| 3,686,458 | 8/1972 | Denel | 335/216 X |

Primary Examiner—C. L. Albritton
Attorney, Agent, or Firm—Sughrue, Rothwell, Mion, Zinn & Macpeak

[57] ABSTRACT

A superconductive switch having a high operating rhythm. The superconductive material in a thin layer is cooled by a permeable fibre glass strip which brings the cryogenic fluid into contact with it. Application to the feeding of a device by successive discharges of a superconductive storage winding.

4 Claims, 1 Drawing Figure

U.S. Patent     April 5, 1977     4,016,526
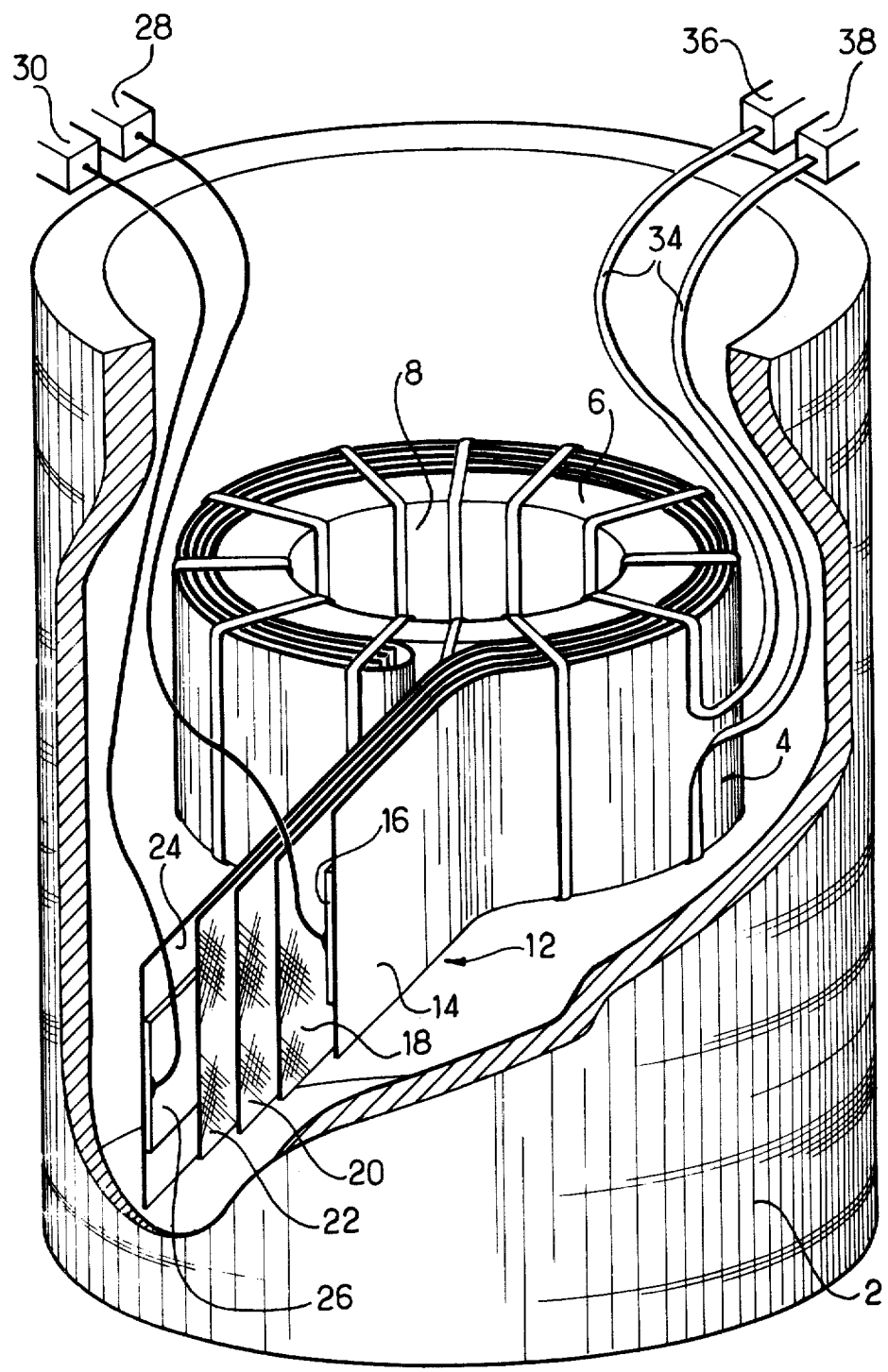

SUPERCONDUCTIVE SWITCH

The present invention concerns a superconductive switch. It is known that such switches comprise a superconductive winding which has a zero electrical resistance when it is suitably cooled by a cryogenic fluid, this corresponding to the "closed" state of the switch, and means for "opening" the latter by making the winding "transit", that is, by making it change to the "normal" state, where it has a high resistance. These means for opening are frequently constituted by a control winding which sends out magnetic field pulse having suitable amplitude and rising time. A quantity of electric power which is often great is then transformed into heat in the winding, raising its temperature very much above the critical temperature. The return to the superconductive state is then impossible during the time necessary for cooling back the superconductive winding. If it is sought to increase the operating rhythm of the switch, a limit if formed by that cooling time, which it would therefore be an advantage to reduce.

Such is, more particularly, sometimes the case when the switch is connected up between the terminals of a superconductive winding for the storing of electric power. The storage winding is charged by a suitable source, the switch being open. When the intensity has reached a sufficient value, the switch is closed and the source is disconnected. When the power stored is to be discharged into a load device, the latter is connected up to the terminals of the storage winding and the switch is opened during a suitable time. If that opening time is made as short as the type of load enables, the storage winding is only partly discharged, this enabling subsequent discharges without recharging. The opening time can evidently be made all the shorter and the rhythm of the discharges be made all the higher, as the previously mentioned cooling time is itself shorter.

The present invention has as its aim the reducing of the cooling time of a superconductive switch.

It has as its object a superconductive switch comprising:

Two main terminals;

A superconductive winding connected up between the said two main terminals;

Means for keeping a cryogenic fluid in contact with that winding so that it may be in its superconductive state, Two conrol terminals;

And a control winding connected up between the said two control terminals and making it possible to apply to that winding a magnetic field suitable for making it change over to its resistive state;

characterized in that:

The conductor forming the said superconductive winding is in the form of a superconductive strip whose width is substantially parallel to the axis of that windng;

A permeable strip whose width is also parallel to the said axis being placed in contact with at least one face of the said superconductive strip on the greatest part of the length of the latter, that permeable strip consisting of a material suitable for allowing the flowing of the said cryogenic fluid in its pores so as to bring it into contact with the said face of the superconductive strip.

By means of the single diagrammatic FIGURE herewith, a method of implementing the invention having no limiting character, will be described hereinafter. The elements which correspond to each other in several of these figures are designated therein by the same reference numerals. The single FIGURE is a partly exploded perspective view of a superconductive switch according to the invention.

That superconductive switch according to the invention comprises a cryostat 2, filled with a cryogenic fluid consisting of liquid helium and containing a superconductive winding 4. That winding comprises a cylindrical insulating mandrel 6 having a substantially circular cross-section, having a vertical axis and an outide radius of 61 mm, leaving a central hole 8 empty. A compound strip 12, which will be described herebelow and which contains several superconductive strips, is wound round that mandrel in several superimposed layers in a spiral configuration.

A control winding 34, constituted by a strip of insulated copper having a thickness of 0.5 mm and a width of 5 mm is arranged in a conventional manner round the assembly formed by the mandrel 6 and the layers of the compound strip 12. That winding comprises 44 turns. It is of the toroidal type, that is, at each turn, it crosses through the central hole 8. It allows between its adjacent turns, gaps enabling the cryogenic fluid to be in contact with the winding 4. Its ends are connected to the control terminals 36 and 38 previously mentioned, by which electrical control pulses suitable for making the superconductive strips of the compound strip 12 change over to the normal state are applied. It is known that these pulses can have an amplitude which is insufficient for making the magnetic field rise above the critical field of the superconductive strip 10, on condition that they have a sufficiently short rising time.

The compound strip 12 is wound in a spiral configuration of 65 turns about the mandrel 6. It is constituted by a stack of five strips having the same width, 45 mm and being coextensive. These strips are the following, from the outside of the winding 4 towards the inside:

1. An "outside" support strip, constituted by ethyleneglycol poyterephtalate, known by the trade names of "mylar" and "terphane" with a thickness of 12 microns. An "outside" superconductive strip 16 having a width of 20 mm and a thickness of 1.3 microns, consisting of an alloy containing, by weight, 35% of lead and 65% of bismuth has been laid in the axis of that strip and on its surface facing towards the inside of the winding 4.

2. An "outside" permeable strip 18 having a thickness of 95 microns constituted by a glass fabric whose fibres have a diameter of about 50 microns. That fabric contains 2 layers each formed by 2 fibres per millimetre in both directions, (having a proportion of empty space of about 50%). Fibres of another insulating material could be used.

3. A "middle" insulating strip 20 made of the same material as the support strip 14 and having a thickness of 13 microns.

4. An "inside" permeable strip 22 identical to the strip 18.

5. An "inside" support strip 24 identical to the strip 14 and provided with a superconductive strip 26 on its surface facing towards the inside of the winding 4.

The permeable strips 18 and 22 and the middle insulating strip 20 end before the inside end of the compound strip 12, so as to enable the outside superconductive strip 16 and inside conductive strip 26 to be in contact with each other at that end. At the other end of the compound strip 12, the strips 16 and 26 are respectively connected to two terminals 28 and 30 constituting the main terminals of the switch according to the invention. The strip 16 therefore constitutes an "outgoing" wire and the strip 26 constitutes an "in-coming" wire, so that the inductance of the winding 4 be very slight.

The contact between the strips 16 and 26 at the inside end of the compound strip 12 is effected by the fact that one and the same support strip provided on one face with a superconductive strip forms the assembly consisting of the two support strips 14 and 24 provided with the two superconductive strips 16 and 26. That single support strip is folded back over itself at the inside end of the compound strip 12 so that the fold be arranged in the breadthwise direction of these strips, that is, parallel to the axis of the winding 12 and that the superconductive strip be placed on the inside of the fold.

The present invention has been implemented to transfer the power of a superconductive storage winding in a resistive load. To do this, the superconductive winding of four modular elements identical to the device described above are brought in parallel (the control windings being in series) and connected between a terminal of the storage winding and a terminal of the resistance. In the closed state, the current flowing in the storage winding-switch circuit is 70 A, this corresponding to a stored power of 10 KJ in the inductance. When a 1500 V pulse with a rising time of 600/us is applied to the control windings, the switch opens, that is, its resistance rises to 70 ohms and the power is transferred into the 14-ohm load with a peak power of 45 kW. Due to the present invention, the switch can be closed as soon as the discharge ends, whereas similar switches not implementing the present invention would have required a cooling time greater than or equal to one minute.

It must be understood that certain of the arrangements described can be modified without losing the advantages of the invention. The compound strip 12 could, for example, be wound in helical layers about a rectangular mandrel, on condition, however, that a gap subsist between two adjacent turns of the helix, so as to allow the cryogneic fluid to reach the edges of the permeable strips 18 and 22. The function of these permeable strips is, indeed, to bring the cryogenic fluid into contact with one face of each of the superconductive strips 16 and 26.

It is furthermore evident that, according to the substance for the superconductive material used, other cryogenic fluids could prove to be suitable.

We claim:

1. Superconductive switch comprising:

Two main terminals;

A superconductive winding connected between said two main terminals;

Means for keeping a cryogenic fluid in contact with said winding, so that it may be in its superconductive state;

Two control terminals;

And a control winding connected between said two control terminals and making it possible to apply to said control winding a magnetic field suitable for making it change over to its resistive state;

And characterized in that:

The conductor forming said superconductive winding is in the form of a superconductive strip whose width is substantially parallel to the axis of that winding;

A permeable strip whose width is also parallel to said axis is placed in contact with at least one face of said superconductive strip on the greatest part of the length of the latter, that permeable strip consisting of a material suitable for allowing the flowing of the cryogenic fluid in its pores so as to bring the fluid into contact with said face of the superconductive strip; and Said superconductive strip forms a thin layer fixed onto one face of a support insulating strip, and remains at a distance from the two edges of that support strip, said permeable strip placed in contact with that thin layer having substantially the same width and being substantially coextensive with said support strip.

2. Switch according to claim 1, characterized in that said superconductive winding is formed by a winding of a compound strip constituted by five strips having substantially the same width and being coextensive, stacked in the following order, from the outside of said superconductive winding towards the inside:

An outside support strip portion provided witn an outside superconductive strip portion on its surface facing towards the inside of said superconductive winding;

An outside permeable strip;

A middle insulating strip;

An inside permeable strip;

An inside support strip portion provided with an inside superconductive strip portion on its surface facing towards the inside of said superconductive winding;

Said permeable strips and said middle insulating strip ending before a first end of said compound strip;

Said outside superconductive strip and inside superconductive strip portions being in contact with each other at said first end of the compound strip and connected respectively to the two main terminals of said switch at the second end of that compound strip.

3. Switch according to claim 2, characterized in that said support strip, provided on one face with said superconductive strip, forms the assembly comprising said outside support strip and inside support strip portions provided with said inside and outside superconductive strip portions, respectively, and is folded back on itself at said first end of said compound strip so that the fold is arranged in the breadthwise direction of these strips and that said superconductive strip is placed on the inside of the fold.

4. Switch according to claim 3, characterized in that said superconductive winding is formed at least partly by said compound strip wound in spiral around a central hole having substantially the shape of a cylinder, said first end of the compound strip extending alongside the central hole;

Said control winding being constituted by a linear conductor wound around the turns of said spiral and crossing through said central hole at each turn, the successive turns of said control winding leaving between them gaps enabling said cryogneic fluid to reach said permeable strips.

* * * * *